United States Patent [19]

Yahata et al.

[11] Patent Number: 5,237,206
[45] Date of Patent: Aug. 17, 1993

[54] LOW-MELTING POINT GLASS SEALED SEMICONDUCTOR DEVICE AND METHOD OF MANUFACTURING THE SAME

[75] Inventors: Masamitsu Yahata, Kawasaki; Noriyoshi Tozawa, Yokohama; Toshiki Tsushima, Kawasaki, all of Japan

[73] Assignee: Kabushiki Kaisha Toshiba, Kawasaki, Japan

[21] Appl. No.: 969,525

[22] Filed: Oct. 30, 1992

Related U.S. Application Data

[63] Continuation of Ser. No. 668,325, Mar. 14, 1992, abandoned, which is a continuation of Ser. No. 554,524, Jul. 20, 1990, abandoned, which is a continuation-in-part of Ser. No. 542,776, Jun. 25, 1990, abandoned.

[30] Foreign Application Priority Data

Jul. 21, 1989 [JP] Japan .................................. 1-189294
Jul. 16, 1990 [JP] Japan .................................. 2-187753

[51] Int. Cl.$^5$ ...................... H01L 23/28; H01L 23/30
[52] U.S. Cl. ..................... 257/794; 257/787; 257/729
[58] Field of Search ............... 357/72, 74, 68, 72, 357/74, 68; 257/786, 794, 729

[56] References Cited

U.S. PATENT DOCUMENTS

| | | | |
|---|---|---|---|
| 4,445,274 | 5/1984 | Suzuki et al. | |
| 4,818,821 | 4/1989 | Wentworth et al. | 357/74 |
| 4,931,854 | 6/1990 | Yonemasu et al. | 357/70 |
| 4,954,874 | 9/1990 | Miura | 357/74 |

FOREIGN PATENT DOCUMENTS

| | | | |
|---|---|---|---|
| 0012052 | 1/1986 | Japan | 357/70 |
| WO88/03704 | 5/1988 | PCT Int'l Appl. | |
| 2084399A | 4/1982 | United Kingdom | |

OTHER PUBLICATIONS

"Mechanical Properties of Liquid-Phase-Bonded Copper-Ceramic Substrates", Mar. 1982, M. Wittmer, C. R. Boer, and P. Gudmundson, Journal American Ceramic Soc. vol. 65, No. 3.

*Primary Examiner*—Rolf Hille
*Assistant Examiner*—S. V. Clark
*Attorney, Agent, or Firm*—Finnegan, Henderson, Farabow, Garrett & Dunner

[57] ABSTRACT

A low-melting point glass sealed semiconductor device comprises a pair of ceramic substrates, each of which is shaped like an arch. The ceramic substrates are overlaid with each other, in such a manner as to define a space between them. Through this space, a gas generated from a thermosetting mounting agent used for adhesion is guided to the outside of the semiconductor device.

6 Claims, 7 Drawing Sheets

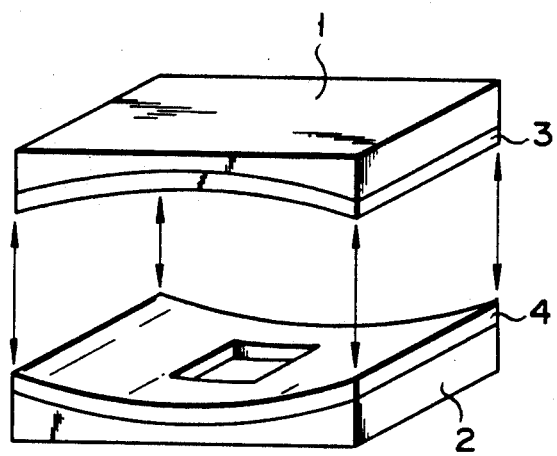
F I G. 6
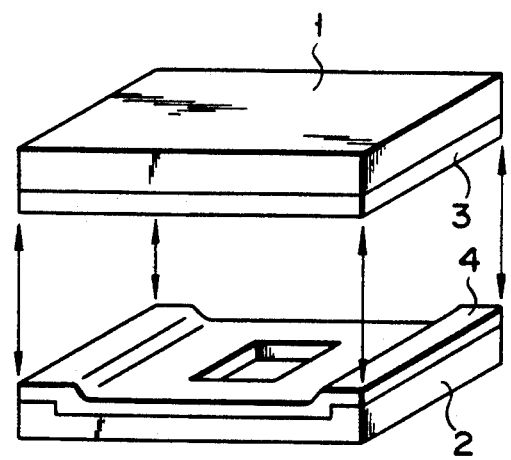
F I G. 8A
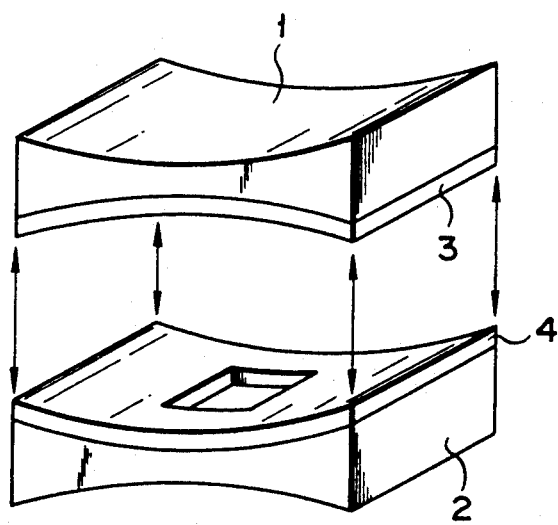
F I G. 7
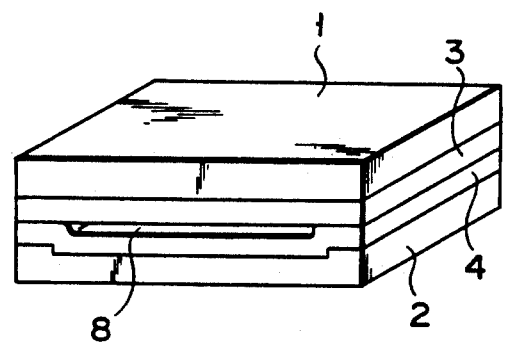
F I G. 8B
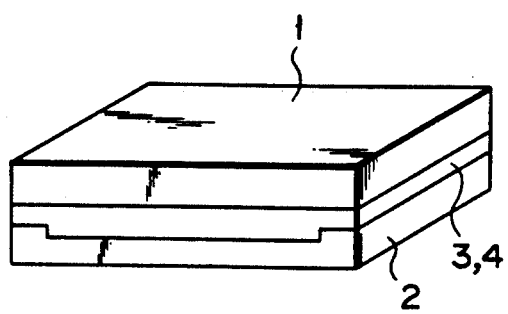
F I G. 8C

5,237,206

LOW-MELTING POINT GLASS SEALED SEMICONDUCTOR DEVICE AND METHOD OF MANUFACTURING THE SAME

This application is a continuation of application Ser. No. 07/668,325 filed Mar. 14, 1992, now abandoned, which was a continuation of application Ser. No. 07/554,524 filed Jul. 20, 1990, now abandoned, which was a continuation-in-part of application Ser. No. 07/542,776 filed Jun. 25, 1990, now abandoned.

BACKGROUND OF THE INVENTION

1. Field of the Invention

The present invention relates to a low-melting point glass sealed semiconductor device containing a semiconductor chip which is die-bonded to a ceramic substrate by use of a thermosetting mounting agent.

2. Description of the Related Art

As is shown in FIG. 1, a conventional low-melting point glass sealed semiconductor device comprises: a ceramic substrate 1 coated with low-melting point glass 3 and serving as a cap; and a ceramic substrate 2 coated with low-melting point glass 4 and having a chip 5 thereon. The substrates 1 and 2 are overlaid with each other, with their glass-coated sides overlapped, and are then subjected to heat treatment. After melted by this heat treatment, the glass coated on the substrates 1 and 2 sets or hardens, thereby sealing the chip 5 on the ceramic substrate 2.

The conventional low-melting point glass sealed semiconductor device shown in FIG. 1 will be described in more detail. The semiconductor chip 5 is located on the predetermined position of the ceramic substrate 2. The semiconductor chip 5 is adhered to the ceramic substrate 2 by use of a thermosetting mounting agent (not shown). Normally, a polyimide-based agent is used as this thermosetting mounting agent, since it enables efficient work and provides reliable adhesion and since it is lower in price than gold paste. A lead frame 6 is located on low-melting point glass 4. It is electrically connected to the semiconductor chip 5 by wires 7. The ceramic substrate 1 serving as a cap is adhered to the other ceramic substrate 2. Between these ceramic substrates 1 and 2, the lead frame 6 is sandwiched and hermetically sealed. It should be noted that the thermosetting mounting agent used in the semiconductor device has a characteristic of decomposing into a gas at a high temperature.

The low-melting point glass sealed semiconductor device mentioned above is manufactured as follows. First, the ceramic substrate 2 is coated with low-melting point glass 4 in a similar manner to that in a printing process, except for the portion on which the semiconductor chip 5 is to be mounted. Next, the lead frame 6 is mounted on the low-melting point glass 4, and the chip 5 is mounted on the portion which is not coated with the glass, by use of the thermosetting mounting agent. Thereafter, the lead frame 6 and the semiconductor chip 5 are electrically connected together by wires 7. Next, the low-melting point glass 3 on ceramic substrate 2 and the low-melting point glass 4 on ceramic substrate 3 are heated at a temperature higher than their melting points. In the state where the glass is melted, the ceramic substrates 1 and 2 are overlaid with each other and hermetically sealed.

However, the conventional semiconductor device mentioned above cannot be fabricated at high yield and is not very reliable with respect to the sealed characteristic. This is because the thermosetting mounting agent it uses is likely to decompose into a gas at a high temperature. If the thermosetting mounting agent hardens, gas voids are generated in the low-melting point glass 3, 4. In addition, the gas spreads along the surface of the lead frame 6, so that a tunnel-like void extending from the interior of the glass to the outside of the semiconductor device is formed, resulting in defective adhesion.

SUMMARY OF THE INVENTION

Accordingly, the first object of the present invention is to provide a low-melting point glass sealed semiconductor device, which has few voids (externally-exposed ones and internal ones) in the glass portion thereof, is reliable in both sealed characteristic and operation and yet low in price, and can be manufactured at high yield. The second object of the present invention is to provide a method of manufacturing such a semiconductor device.

To achieve the first object, the present invention provides a low-melting point glass sealed semiconductor device which comprises:
- a first ceramic substrate made by curving a plate, three sides of which form a rectangle and the fourth side of which is arcuate, around an axis parallel to one of two axes of the plate with a predetermined curvature;
- a semiconductor chip adhered to a central portion of an inwardly-curved surface of the first ceramic substrate by use of a polyimide-based thermosetting mounting agent;
- a second ceramic substrate made by curving a plate, three sides of which form a rectangle, and the fourth side of which is arcuate, around an axis parallel to one of the two axes of the plate with a predetermined curvature; and
- a filler member including: low-melting point glass which is coated on the inwardly-curved surface of the first ceramic substrate, except for a portion to which the semiconductor chip is adhered; and low-melting point glass which is coated on an inwardly-curved surface of the second ceramic substrate;
- wherein the first and second ceramic substrates are stacked upon each other, with their inwardly-curved surfaces facing each other and with their straight side edges in contact with each other, and a space defined between the first and second ceramic substrates is filled with the filler member.

To achieve the second object, the present invention provides a method of manufacturing a low-melting point glass sealed semiconductor device, which comprises the steps of:
- preparing first and second ceramic substrates each of which has a rectangular shape and is curved around one of two axes thereof with a predetermined curvature;
- coating low-melting point glass on an inwardly-curved surface of the first ceramic substrate, except for a portion to which a semiconductor substrate is to be adhered;
- adhering the semiconductor substrate to a central portion of the inwardly-curved surface of the first ceramic substrate by use of a polyimide-based thermosetting mounting agent;
- coating low-melting point glass on an inwardly-curved surface of the second ceramic substrate;

bringing straight side edges of the first and second ceramic substrates into contact with each other, with the inwardly-curved surfaces thereof facing each other; and gradually heating the first and second ceramic substrates, such that a gas generated from part of the thermosetting mounting agent is first guided to the outside of the device through a space defined between the curved ceramic substrates and then the low-melting point glass melted by heat fills the space and hardens.

In the low-melting point glass sealed semiconductor device of the present invention, the low-melting point glass does not contain a void arising from a gas generated by the thermosetting mounting agent. In addition, the semiconductor device does not have a tunnel-like void extending along the lead frame, i.e., a tunnel-like void extending from the interior of the glass to the outside of the semiconductor device. Therefore, the semiconductor device is reliable in its sealed characteristic.

In the manufacturing method of the present invention, the gas produced by the decomposition of part of the thermosetting mounting agent escapes to the outside the device through the space defined between the first and second ceramic substrates. After the gas is completely expelled from the device, the low-melting point glass is melted, thereby filling the space and adhering the first and second ceramic substrates to each other.

Additional objects and advantages of the invention will be set forth in the description which follows and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 and FIG. 7 are perspective views of other embodiments of the present invention; and FIG. 8A to FIG. 8C are perspective views showing the manufacturing steps of still another embodiment of the present invention.

DETAILED DESCRIPTION OF THE PREFERRED EMBODIMENTS

The low-melting point glass sealed semiconductor device according to one embodiment of the present invention and the manufacturing method thereof will now be described, with reference to the accompanying drawings.

Figure 1:
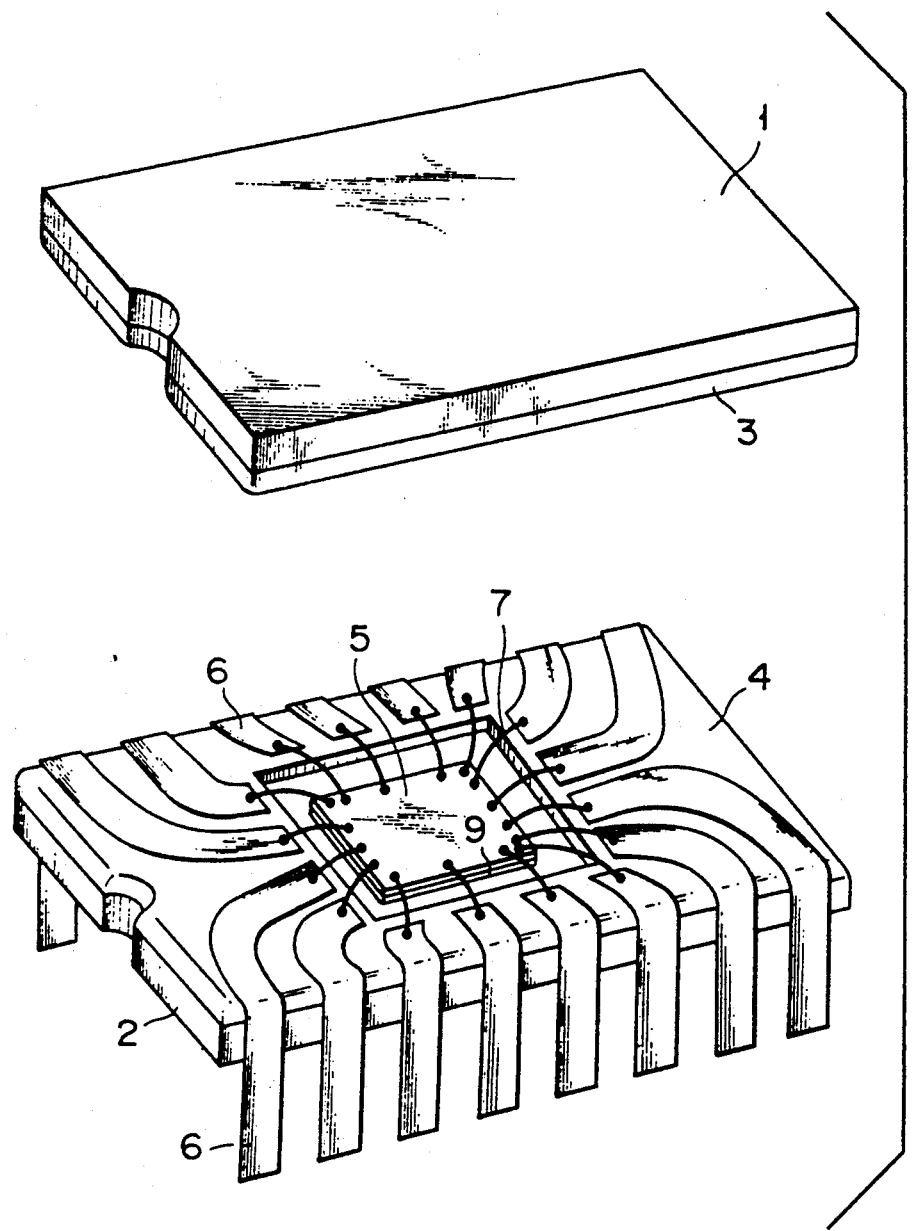
FIG. 1 is a perspective view of a conventional low-melting point glass sealed semiconductor device.
Figure 2:
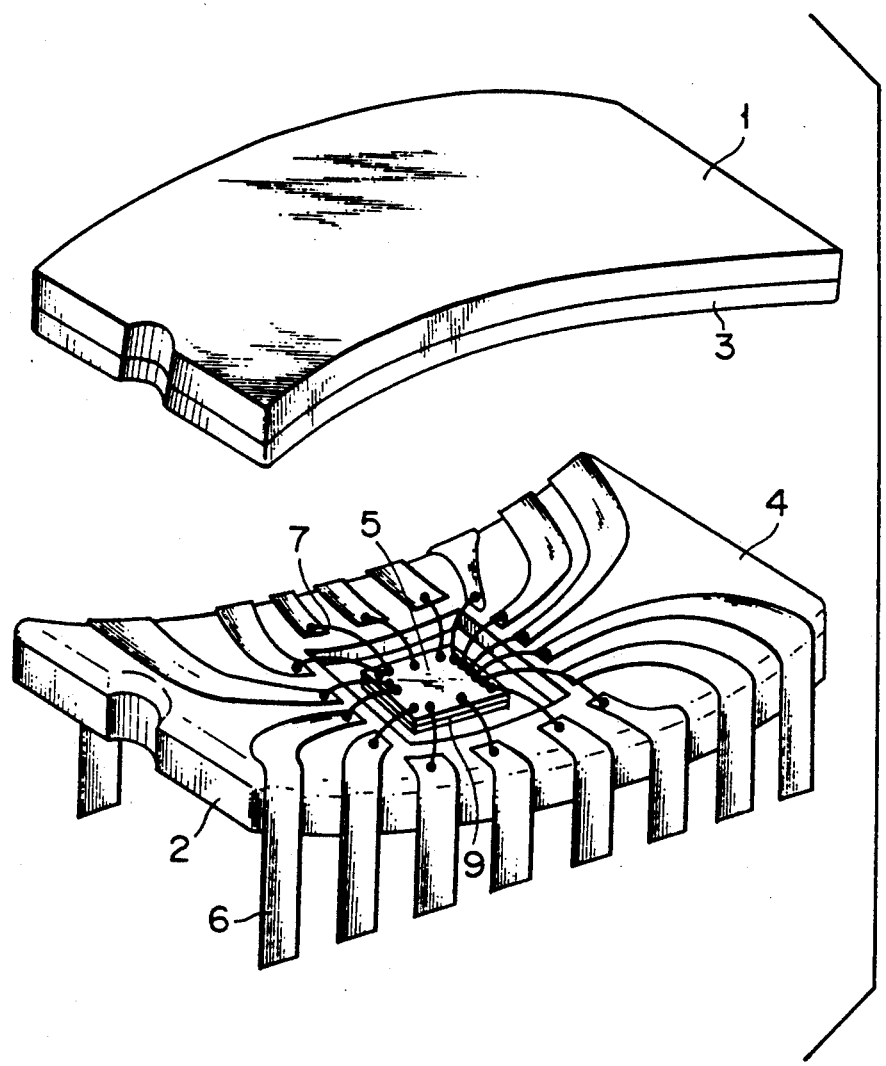
FIG. 2 is a perspective view of a low-melting point glass sealed semiconductor device of the present invention.

FIG. 2 is a perspective view of the low-melting point glass sealed semiconductor device according to one embodiment of the present invention.

As shown in FIG. 2, a ceramic substrate 1 (which is used as a cap) and a ceramic substrate 2 (on which a semiconductor chip is to be installed) are both rectangular. They are curved around one of the two axes thereof with a predetermined curvature and look like arches. That is, they are warped when they have been manufactured. Low-melting point glass 3 is coated on the inwardly-curved surface of ceramic substrate 1. Likewise, low-melting point glass 4 is coated on the inwardly-curved surface of ceramic substrate 2. A semiconductor chip 5 is adhered to a predetermined portion on the inwardly-curved surface of ceramic substrate 2 by use of a thermosetting mounting agent 9. As in the prior art, this thermosetting mounting agent is a polyimide-based agent.

A lead frame 6 is attached to low-melting point glass 4. More specifically, the lead frame 6 is first placed on low-melting point glass 4, and then the resultant structure is made to pass through a furnace, so as to heat the lead frame 6 to a predetermined temperature. Accordingly, the lead frame 6 is melted and adhered to the low-melting point glass 4. Thereafter, the lead frame 6 is electrically connected to the semiconductor chip 5 by means of wires 7. After this connection, the ceramic substrate 1 serving as a cap is mounted on the ceramic substrate 2, with the inwardly-curved surfaces overlapped with each other, in such a manner as to provide a space between the two ceramic substrates. In this state, the two ceramic substrates are subjected to a bonding step, thereby obtaining the low-melting point glass sealed semiconductor device of the present invention.

The method of manufacturing the low-melting point glass sealed semiconductor device will be described, with reference to FIGS. 3A through 3C.

Figure 3A:
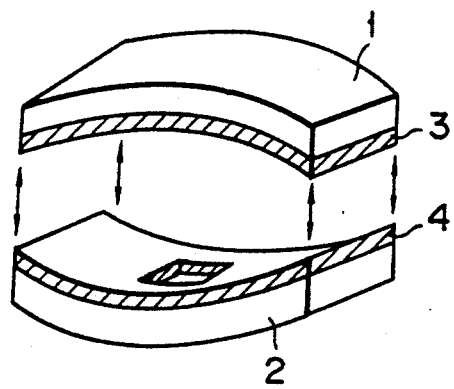
FIGS. 3A to 3C illustrate the process in which the low-melting point glass sealed semiconductor device of the present invention is manufactured.
Figure 3B:
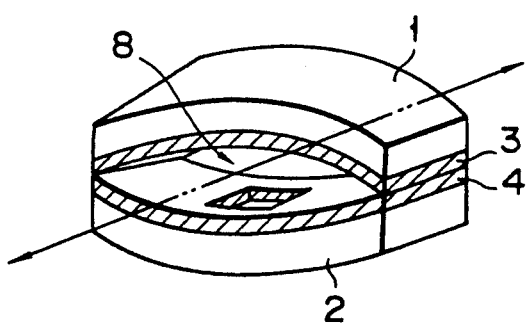
Figure 3C:
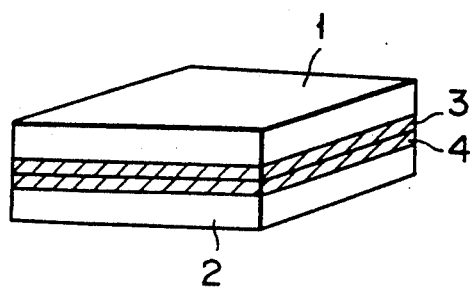

FIGS. 3A to 3C are perspective views schematically illustrating the process in which the low-melting point glass sealed semiconductor device according to one embodiment of the present invention is manufactured.

First of all, two ceramic substrates 1 and 2 are prepared. As is shown in FIG. 3A, each of the ceramic substrates is rectangular in shape and is curved around one of the two axes thereof with a predetermined curvature. In the curved state, the ceramic substrates are baked. The inwardly-curved surface of ceramic substrate 1 is entirely coated with low-melting point glass 3. The inwardly-curved surface of ceramic substrate 2 is also coated with low-melting point glass 4, but this coating is performed except for the portion on which a semiconductor chip is to be mounted. These coating steps are carried out in a manner similar to that of a printing process. Next, a lead frame (not shown in FIG. 3A) is mounted on the low-melting point glass 4 of ceramic substrate 2, and in this state the substrate 2 is heated, to thereby cause the lead frame to adhere to the glass. Further, a semiconductor chip (not shown in FIG. 3A) is adhered to the installation portion on the inwardly-curved surface by use of a thermosetting mounting agent (not shown in FIG. 3A). Next, wire bonding is performed, wherein the lead frame is connected to the semiconductor chip by means of wires (not shown in FIG. 3A).

Next, an adhesion step carried out. As is shown in FIG. 3B, the two ceramic substrates 1 and 2 are stacked upon each other in such a manner as to define a space therebetween. That is, they are stacked, with their inwardly-curved surfaces overlapped. In this state, the ceramic substrates 1 and 2 are placed in a furnace (not shown) for heating. In the initial stage of the adhesion step, the low-melting point glass 3, 4 does not melt, so that there is a space between the two substrates, as is indicated by 8 in FIG. 3B. As the thermosetting mounting agent becomes higher in temperature with time, it begins to decompose into a gas. However, this gas is discharged from the semiconductor device through the space 8 mentioned above, and does not remain inside the device. In other words, the space 8 continues to exist at temperatures at which the thermosetting mounting agent decomposes and generates a gas. This condition will be explained, referring to the graph shown in FIG. 4.

Figure 4:
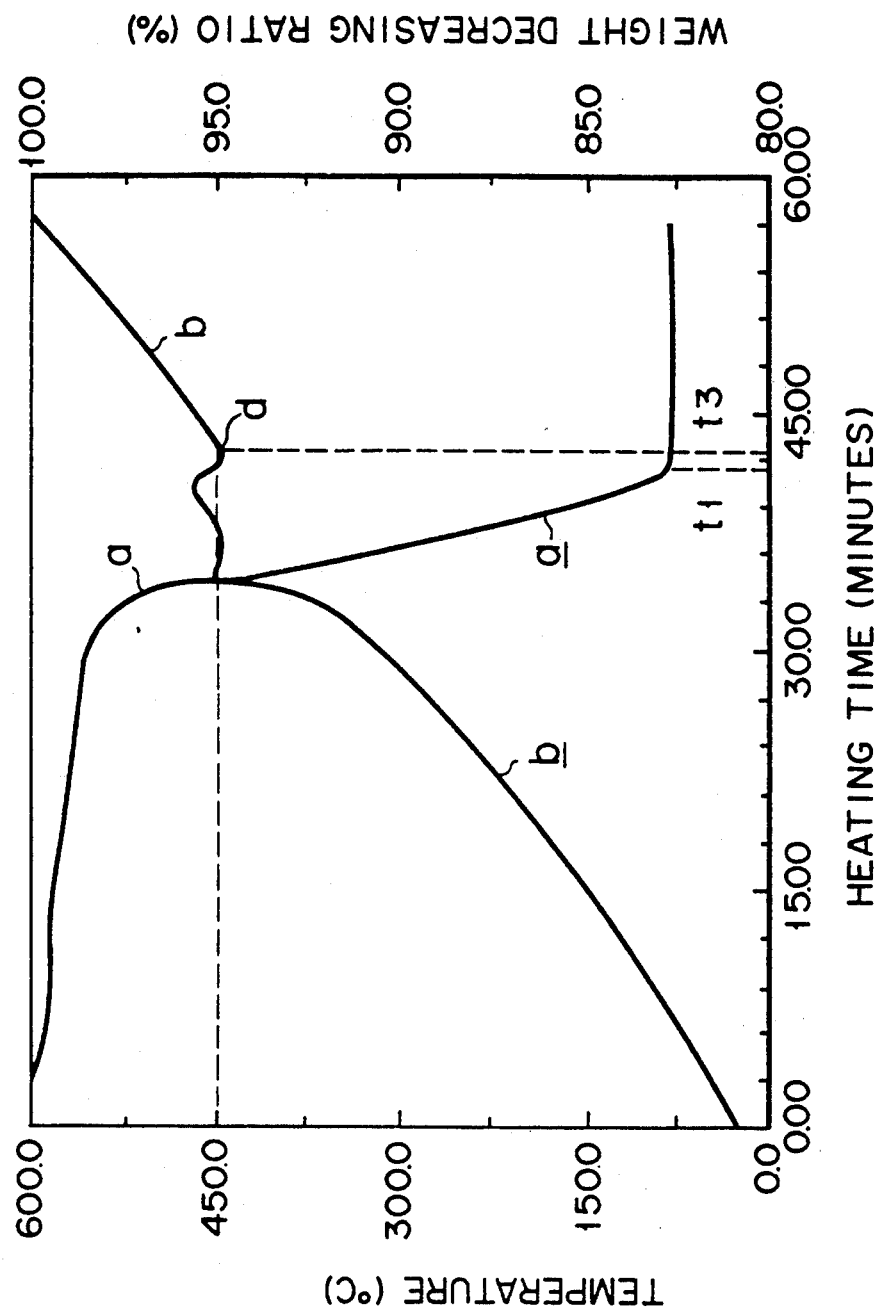
FIG. 4 is a graph showing how the temperature and weight of a thermosetting mounting agent vary in relation to heating time.

FIG. 4 is a graph showing how the temperature and weight of a thermosetting mounting agent vary in relation to heating time.

In FIG. 4, curve a represents a weight-decreasing ratio of the thermosetting mounting agent, while curve b represents a temperature increase of the thermosetting mounting agent.

How to use the graph shown in FIG. 4 will be briefly explained. At time t3, the weight-decreasing ratio of the mounting agent is about 82.5%, as is readily understood from the graph. In this case, a line segment is drawn in parallel to the ordinate from that point on curve a which corresponds to time t3 until it intersects line b. From this intersection, a line segment is drawn in parallel to the abscissa until it intersects the ordinate, and the temperature value at this intersection is read. In this way, it is understood that a weight-decreasing ration of 82.5% corresponds to a temperature of about 450° C.

As can be understood from curve a in the graph shown in FIG. 4, the weight of the mounting agent abruptly decreases at the point where the temperature exceeds 350° C. This means that the mounting agent is decomposed into a gas from this point. The decomposition of the mounting agent (i.e., the generation of a gas) continues until the point where the temperature is about 450° C., as may be understood from curve b in FIG. 4.

At 450° C., low-melting point glass 3, 4 begins to change from a solid state into a liquid state. The low-melting point glass in this transition state has a certain degree of viscosity, but can keep the shape which it has in the solid state. In other words, the space 8 between the ceramic substrates 1 and 2 is maintained in the transition state of the low-melting point glass.

As may be understood from the above, time t3 at which the low-melting point glass changes into the liquid state should be after time t1 at which the gas generation is completed. As long as this requirement is satisfied, all gas is discharged from the semiconductor device through the space 8.

After time t3, the low-melting point glass 3, 4 changes into a liquid state, thus filling the space 8 between the two ceramic substrates 1 and 2, as is shown in FIG. 3C. More specifically, the low-melting point glass 3, 4 in the fluid state flows into the space 8. After the space 8 is filled with the low-melting point glass, the heating is stopped, so as to change the low-melting point glass back into the solid state.

In the above process, the low-melting point glass sealed semiconductor device of one embodiment of the present invention is manufactured.

Figure 5A:
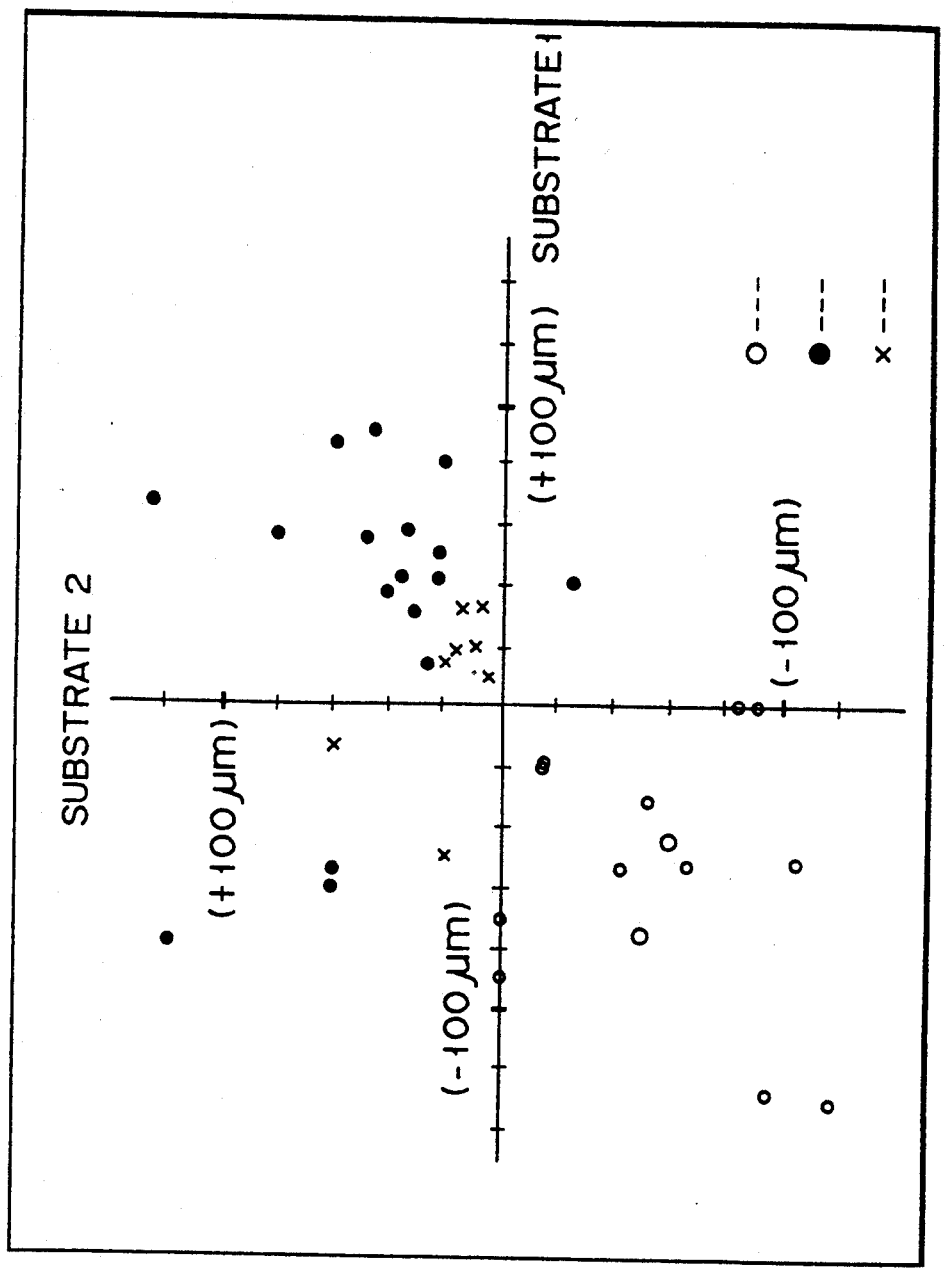
FIG. 5A is a graph showing the distribution of satisfactory and defective products in relation to the shapes of ceramic substrates.

FIG. 5A is a graph showing the distribution of satisfactory and defective products, the graph being obtained by examining low-melting point glass sealed semiconductor devices whose ceramic substrates have such a shape as is determined in the present invention and by examining low-melting point glass sealed semiconductor devices whose ceramic substrates do not have such a shape as is determined in the present invention.

In FIG. 5A, the abscissa represents the maximum displacement by which the ceramic substrate 1 serving as a cap is located away from the contact plane in which substrate 1 and substrate 2 contacts each other, while the ordinate represents the maximum displacement by which the ceramic substrate 2 having a semiconductor chip thereon is located away from the same contact plane.

The displacements shown in FIG. 5A will be explained in more detail, with reference to the cross sectional views shown in FIGS. 5B to 5D.

Figure 5B:
FIGS. 5B to 5D are views illustrating curved states of ceramic substrates.

The ceramic substrate illustrated in FIG. 5B has such a shape as is determined in the present invention. The maximum displacement of the substrate, which is the distance between the contact plane to the highest point in that surface of the substrate which is coated with the low-melting point glass.

Figure 5C:
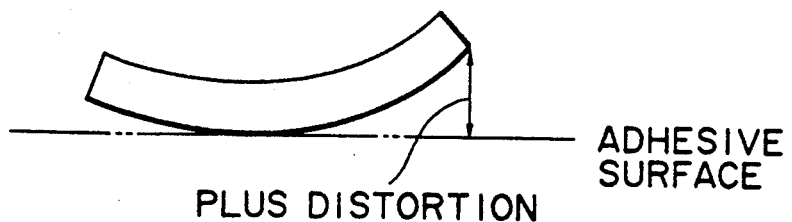

The ceramic substrate illustrated in FIG. 5C also has a shape as is determined in the present invention, but low-melting point glass is coated on the outwardly-curved surface of this substrate. Therefore, the maximum displacement of the substrate with reference to the contact plane is represented by a positive value.

Figure 5D:
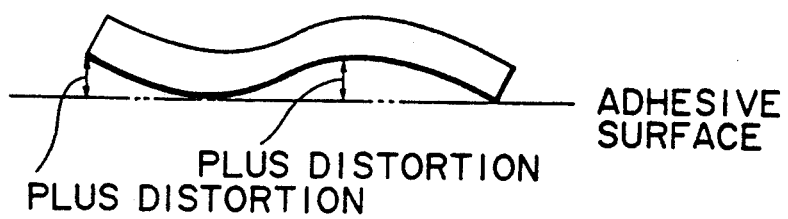

The ceramic substrate illustrated in FIG. 5D is corrugated. In the case of this substrate, the displacements of points located on the glass-coated surface are represented by positive values.

Referring to FIG. 5A, all satisfactory products indicated by ◯ are in the third quadrant, where both the substrates 1 and 2 have negative displacements. As is seen in FIG. 5A, the negative displacements of the substrates 1 and 2 are concentratedly distributed in the region from 20 μm to 120 μm. The upper limit of these negative displacements is determined by the size of the low-melting point glass sealed semiconductor devices, namely, the sizes of substrates 1 and 2. For example, if the substrates 1 and 2 have a surface of approximately 52 mm × 15 mm, the upper limit of the displacements is 120 μm or so.

Defective products indicated and ● and × are either in the first quadrant, where both the substrates 1 and 2 have positive displacements, or in the second and fourth quadrants, where one of the substrates has a positive displacement.

Basically, any defective products indicated by ● is a semiconductor device having two substrates of the type shown in FIG. 5C which are adhered to each other, or a substrate of type shown in FIG. 5C and another substrate of the type shown in FIG. 5B which are adhered to each other. The defective products indicated by × are a semiconductor device wherein at least one of the paired substrates has such a shape as is illustrated in FIG. 5D.

FIG. 6 is a perspective view schematically showing a low-melting point glass sealed semiconductor device according to a second embodiment of the invention. In FIG. 6, the components identical to those shown in FIG. 3A are designated by the same numerals. Only the features which are different from those of the first embodiment will be described.

In the second embodiment, at least those surfaces of substrates 1 and 2 which are coated with low-melting point glass layers 3 and 4, respectively, are arcuate, thus providing such a space as is provided in the first embodiment.

Alternatively, as is shown in FIG. 7, both substrates 1 and 2 may be shaped like a concavo-concave lens. In this case, a space is provided between those surfaces of the substrates 1 and 2 on which low-melting point glass layers 3 and 4 are formed, respectively.

FIGS. 8A to 8C are perspective views, explaining how to manufacture a low-melting point glass sealed semiconductor device according to a fourth embodiment. In these figures, the components identical to those shown in FIGS. 3A to 3C are denoted by the same numerals. With reference to FIGS. 8A to 8C, it will be described how the semiconductor device according to the fourth embodiment is manufactured.

First, as is illustrated in FIG. 8A, a shallow groove is formed in that surface of ceramic substrate 2 which is used as a base and opposes ceramic substrate 1, in order to provide a space 8 between the substrates 1 and 2 as in the first embodiment. A semiconductor chip (not shown) is fixed onto that surface of the ceramic substrate 2 by means of thermosetting material. Then, the ceramic substrate 1, which is used as a cap, is mounted on the ceramic substrate 2, thus forming an unfinished product having the space 8 between the substrates 1 and 2.

Next, as is shown in FIG. 8B, the unfinished product is placed in a furnace (not shown) and is heated therein, whereby the thermosetting material is thermally set, and the decomposed gas emanates from the thermosetting material.

As the unfinished product is further heated in the furnace, the low-melting point glass layers formed on the opposing surfaces of the substrates 1 and 2 melt. Hence, the substrate 1 is pressed onto the substrate 2 under its own weight, whereby the molten glass fills up the space 8. Then, the unfinished product is cooled, and the glass solidifies. As a result, the semiconductor chip (not shown) is sealed in airtight fashion.

Obviously both the second embodiment and the third embodiment can achieve the same advantages as the first embodiment.

In the low-melting point glass sealed semiconductor device of the present invention, the gas which is generated from the thermosetting mounting agent in the adhesion step hardly remains inside the device. Since the formation of voids noted above is suppressed, the semiconductor device is satisfactory in operation. Further, the method of the present invention enables such satisfactory semiconductor devices to be manufactured at high yield.

In the low-melting point glass sealed semiconductor device of the present invention, the two ceramic substrates have substantially the same shape. Therefore, the space produced when such ceramic substrates are stacked upon each other is located in the center of the semiconductor device. Thus, the formation of voids can be effectively suppressed.

As mentioned above, the low-melting point glass sealed semiconductor device of the present invention is very reliable in its sealed characteristic. In addition, the method of the present invention enables such semiconductor devices to be manufactured at high yield, thus contributing to reduction in the manufacturing cost.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An assembly for making an airtight sealed semiconductor device upon the application of heat, comprising:
    a base and a cap, each having an inner surface, an outer surface and a central portion, wherein the inner surface of at least one of said base and said cap is arcuate;
    a layer of adhesive material covering the inner surfaces of each of said base and cap, said adhesive layers being in physical engagement with each other at adjacent opposite ends with a space between said cap and base increasing from said opposite ends toward the central portion with at least one of said layers having a recess intermediate and spaced from said opposite ends; and
    a semiconductor chip fixed in said recess of the at least one of said layers with a fixing member whereby upon the application of heat said space between said cap and said base decreases until said adhesive layers are in complete contact with each other sealing said semiconductor chip.

2. The assembly according to claim 1, wherein said adhesive member is made of low-melting point glass.

3. The assembly according to claim 1, wherein said fixing member is made of thermosetting material.

4. The assembly according to claim 1, further comprising:
    spaced leads electrically connected to said chip and spaced intermediate between said adjacent opposite ends and extending outside said device.

5. An assembly for making an airtight sealed semiconductor device upon the application of heat, comprising:
    a base and a cap, each having an inner surface, an outer surface and a central portion, wherein the inner surface of at least one of said base and said cap is arcuate;
    a semiconductor chip fixed on the inner surface of one of said cap and base with a fixing member; and
    a layer of adhesive material covering the inner surfaces of each of said base and cap, said adhesive layers being in physical engagement with each other at adjacent opposite ends with a space between said cap and base increasing from said opposite ends toward the central portion and one of said layers surrounding said fixed semiconductor chip whereby upon the application of heat said space between said cap and said base decreases until said adhesive layers are in complete contact with each other sealing said semiconductor chip.

6. An assembly for making an airtight sealed semiconductor device upon the application of heat, comprising:
    a base and a cap, each having an inner surface, an outer surface, and a central portion, wherein the inner surface of at least one of said base and said cap has a portion of decreased thickness intermediate the ends;

a layer of adhesive material covering the inner surfaces of each of said base and cap, said adhesive layers being in physical engagement with each other at adjacent opposite ends with a space between said cap and said base with at least one of said layers having a recess intermediate and spaced from said opposite ends; and a semiconductor chip fixed in said recess of the at least one of said layers with a fixing member whereby upon the application of heat said space between said cap and said base decreases until said adhesive layers are in complete contact with each other sealing said semiconductor chip.

* * * * *